(12) United States Patent
Nagase et al.

(10) Patent No.: US 11,277,011 B2
(45) Date of Patent: Mar. 15, 2022

(54) MANAGEMENT DEVICE, POWER STORAGE SYSTEM

(71) Applicant: Panasonic Intellectual Property Management Co., Ltd., Osaka (JP)

(72) Inventors: Ryosuke Nagase, Osaka (JP); Shinya Nishikawa, Osaka (JP); Takashi Iida, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/961,656

(22) PCT Filed: Feb. 8, 2019

(86) PCT No.: PCT/JP2019/004525
§ 371 (c)(1),
(2) Date: Jul. 10, 2020

(87) PCT Pub. No.: WO2019/176395
PCT Pub. Date: Sep. 19, 2019

(65) Prior Publication Data
US 2020/0403420 A1 Dec. 24, 2020

(30) Foreign Application Priority Data
Mar. 13, 2018 (JP) .............................. JP2018-045899

(51) Int. Cl.
*H02J 7/00* (2006.01)
*H02J 7/02* (2016.01)
(Continued)

(52) U.S. Cl.
CPC ............ *H02J 7/0016* (2013.01); *B60L 58/22* (2019.02); *G01R 31/3835* (2019.01);
(Continued)

(58) Field of Classification Search
CPC .......... H02J 7/0016; H02J 7/0047; H02J 7/02; G01R 31/396; G01R 31/3835;
(Continued)

(56) References Cited

U.S. PATENT DOCUMENTS 7,573,236 B2 * 8/2009 Sugimoto ............... B60L 58/22
320/132
7,777,451 B2 * 8/2010 Chang et al. ......... H02J 7/0016
320/118
(Continued)

FOREIGN PATENT DOCUMENTS

JP 2016-181991 10/2016

OTHER PUBLICATIONS

International Search Report of PCT application No. PCT/JP2019/004525 dated Mar. 19, 2019.

*Primary Examiner* — Sun J Lin
(74) *Attorney, Agent, or Firm* — McDermott Will and Emery LLP (57) ABSTRACT

A voltage detector detects a voltage of each cell of a plurality of cells that are series-connected. A plurality of discharge circuits are respectively parallel-connected to the plurality of cells. A controller performs a control to equalize voltages or capacities of the plurality of cells to a target value by controlling discharge time of the plurality of discharge circuits, based on the voltages of the plurality of cells detected by the voltage detector. The controller sets the target value higher as an amount of change in the voltages of the plurality of cells in a predetermined period is larger.

6 Claims, 4 Drawing Sheets

(51) Int. Cl.
  G01R 31/396 (2019.01)
  G01R 31/3835 (2019.01)
  B60L 58/22 (2019.01)
  H01M 10/48 (2006.01)
  H01M 10/42 (2006.01)

(52) U.S. Cl.
  CPC ........ *G01R 31/396* (2019.01); *H01M 10/425* (2013.01); *H01M 10/482* (2013.01); *H02J 7/0047* (2013.01); *H02J 7/02* (2013.01); *B60L 2240/547* (2013.01); *H01M 2010/4271* (2013.01); *H01M 2220/20* (2013.01)

(58) Field of Classification Search
  CPC ........... H01M 2220/20; H01M 10/482; H01M 10/425; H01M 2010/4271; B60L 2240/547; B60L 58/22
  USPC ........................................................ 320/118
  See application file for complete search history.

(56) References Cited

U.S. PATENT DOCUMENTS

| | | | |
|---|---|---|---|
| 8,217,625 B2 * | 7/2012 | Chang et al. ....... | H01M 10/441 320/118 |
| 9,209,637 B2 * | 12/2015 | Monden et al. .. | H02J 7/007194 |
| 9,293,937 B2 * | 3/2016 | Kawahara et al. . | H01M 10/443 |
| 2020/0361337 A1 * | 11/2020 | Ohmori ................... | B60L 58/16 |
| 2020/0395775 A1 * | 12/2020 | Hayayama et al. .. | H02J 7/0016 |

\* cited by examiner

MANAGEMENT DEVICE, POWER STORAGE SYSTEM

TECHNICAL FIELD

The present invention relates to a management device and a power storage system that manage a state of a plurality of series-connected cells.

BACKGROUND ART

In recent years, hybrid vehicles (HVs), plug-in hybrid vehicles (PHVs), and electric vehicles (EVs) have been widely spreading. These vehicles are mounted with a secondary battery as a key device. Examples of a vehicular secondary battery mainly include a nickel-metal-hydride battery and a lithium-ion battery. It is expected that the lithium-ion battery, which has high energy density, is spreading at an accelerated rate in the future.

In general, in the case of the lithium-ion battery, from the point of view of maintaining power efficiency and securing safety, an equalization process is performed to equalize voltage between a plurality of series-connected cells. When amounts of self-discharge of a plurality of series-connected cells vary between the cells, an actually usable capacity decreases. Specifically, when the capacity of one of the cells reaches a lower limit, discharging is terminated even if the capacities of the other cells do not reach the lower limit. Further, when the capacity of one of the cells reaches an upper limit, charging is terminated even if the capacities of the other cells do not reach the upper limit. In either case, usable capacities cannot be sufficiently used in some cells. The variation of an amount of self-discharge of cell occurs due to production variations and environmental conditions. For example, a cell located closer to a heat source tends to degrade more rapidly.

As the equalization process between cells, the passive balancing method is the main stream. In the passive balancing method, a voltage of a cell having the lowest voltage in a plurality of series-connected cells is set as a target value, and the other cells are discharged, aiming for the target value.

A measured voltage of a cell after end of charging or discharging contains an overvoltage component due to polarization, and the measured voltage will be converging with elapse of time to an open circuit voltage (OCV) containing no overvoltage component. The overvoltage component depends on a negative electrode material, a state of health (SOH), temperatures, and the like, and varies between cells. Therefore, even if cell balancing is performed to equalize the measured voltages between the plurality of cells on the basis of the measured voltages containing overvoltage components, there is a possibility that open circuit voltages (OCVs) are not equalized between the plurality of cells. To address this issue, in general, the cell balancing is started after a predetermined time has elapsed after end of charging or discharging.

Note that there is a method to estimate the OCV of a cell from the measured voltage of the cell in a state where the polarization does not disappear (for example, see PTL 1). However, there is a large error between the estimated OCV and an actual OCV in some cases, and in such a case accuracy of the cell balancing decreases.

CITATION LIST

Patent Literature

PTL 1: Unexamined Japanese Patent Publication No. 2016-181991

SUMMARY OF THE INVENTION

Capacities of in-vehicle batteries have been increased in recent years, and there is a trend that charging time for charging from a normal charger becomes longer. When the charging time becomes longer, an idle period of the battery cell becomes accordingly shorter. Further, it is also studied to employ a negative electrode material having a long depolarization time. As described above, the cell balancing is preferably performed during a period when the cell is idle in a state where polarization has disappeared; however, such a period tends to become shorter.

The present invention has been made in view of the above circumstances, and an object of the present invention is to provide a technique that can steadily perform an equalization process even between a plurality of cells that cannot take sufficient idle time.

To solve the above issue, a management device of an aspect of the present invention include: a voltage detector that detects a voltage of each of a plurality of cells that are series-connected; a plurality of discharge circuits respectively parallel-connected to the plurality of cells; and a controller that performs control to equalize voltages/capacities (voltages or capacities) of the plurality of cells to a target value by controlling discharge time of the plurality of discharge circuits, based on the voltages of the plurality of cells detected by the voltage detector. The controller sets the target value higher as an amount of change in the voltages of the plurality of cells in a predetermined period is larger.

The present invention can steadily perform an equalization process even between a plurality of cells that cannot take sufficient idle time.

DESCRIPTION OF EMBODIMENT

Figure 1:
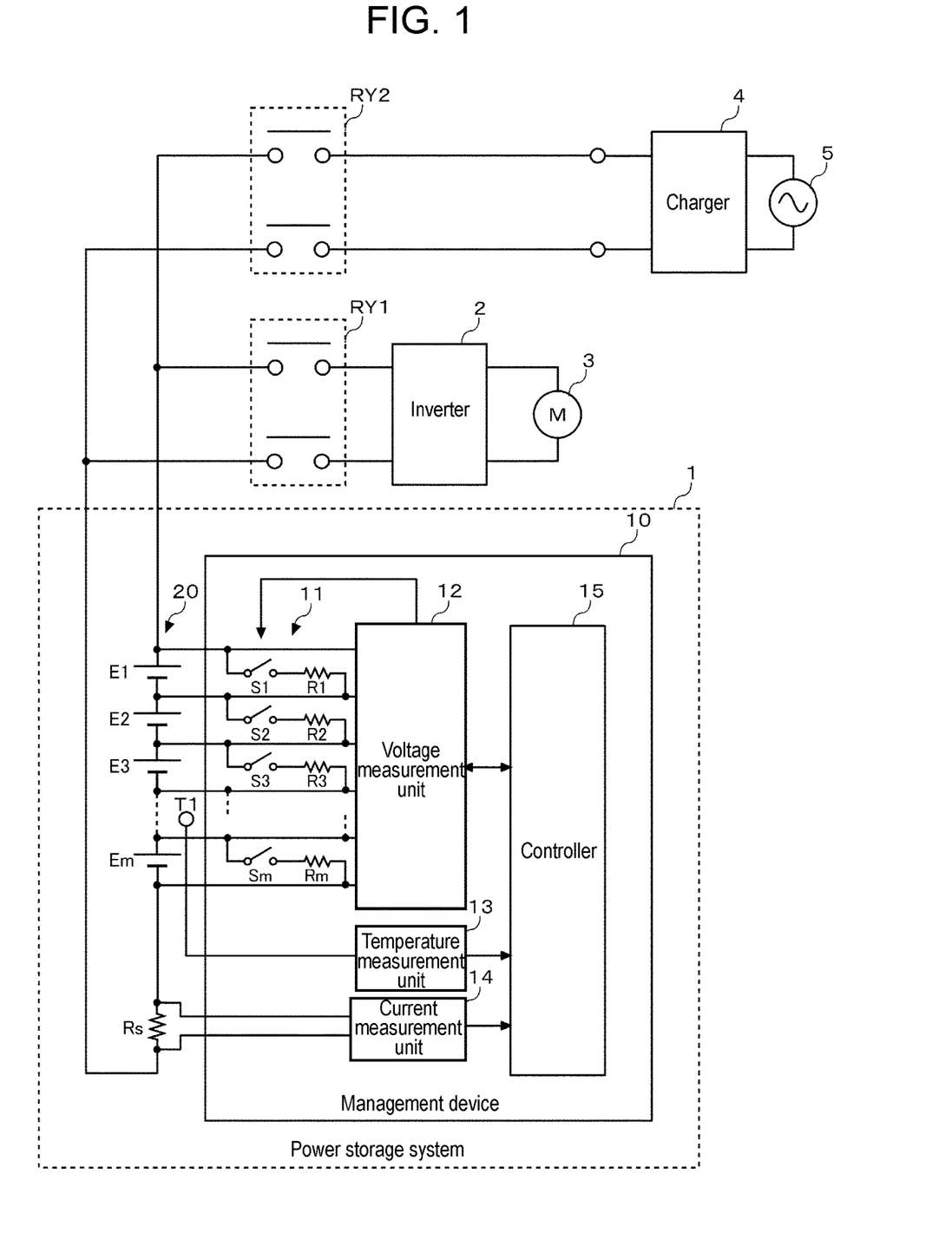
FIG. 1 is a diagram for describing a power storage system according to an exemplary embodiment of the present invention.

FIG. 1 is a diagram for describing power storage system 1 according to an exemplary embodiment of the present invention. The example shown in FIG. 1 is an example in which power storage system 1 according to the present exemplary embodiment is mounted on a vehicle as a drive battery for the vehicle. As the vehicle, an EV or a PHEV that can be charged from a commercial power system (hereinafter, simply referred to as system 5) is assumed.

Power storage system 1 is connected to motor 3 through first relay RY1 and inverter 2. During power running, inverter 2 converts direct-current (DC) power supplied from power storage system 1 into alternate-current (AC) power and supplies the AC power to motor 3. During regeneration, inverter 2 converts AC power supplied from motor 3 into DC power and supplies the DC power to power storage system 1. Motor 3 is a three-phase AC motor and rotates depending on the AC power supplied from inverter 2 during power running. During regeneration, motor 3 converts rotation energy due to deceleration into AC power and supplies the AC power to inverter 2.

First relay RY1 is inserted in connection wires connecting between power storage module 20 of power storage system 1 and inverter 2. During running, management device 10 of power storage system 1 performs control to put first relay RY1 in an on-state (closed state) so as to electrically connect power storage module 20 to the power system of the vehicle. During not running, management device 10 basically performs control to put first relay RY1 in an off-state (open state) so as to electrically shut off between power storage module 20 and the power system of the vehicle. Note that instead of the relay, another type of switch such as a semiconductor switch may be used.

Power storage system 1 includes power storage module 20 and management device 10. Power storage module 20 is formed of a plurality of cells E1 to Em being series-connected. As the cells, secondary batteries such as lithium-ion battery cells, nickel-metal-hydride battery cells, or lead battery cells can be used. In the following, an example of the present specification is assumed to use lithium-ion battery cells (nominal voltage: 3.6 V to 3.7 V). The number of series-connected cells E1 to Em is determined depending on a drive voltage of motor 3.

Shunt resistor Rs is series connected to the plurality of cells E1 to Em. Shunt resistor Rs functions as a current detection element. Note that instead of shunt resistor Rs, a hall element may be used. Further, there is provided temperature sensor T1 to detect a temperature of the plurality of cells E1 to Em. As temperature sensor T1, a thermistor can be used, for example.

Management device 10 includes discharge circuit 11, voltage measurement unit 12, temperature measurement unit 13, current measurement unit 14, and controller 15. Nodes of the plurality of series-connected cells E1 to Em are connected to voltage measurement unit 12 through a plurality of voltage lines. Voltage measurement unit 12 measures a voltage of each cell E1 to Em by measuring each voltage between neighboring two voltage lines. Voltage measurement unit 12 transmits the measured voltage of each cell E1 to Em to controller 15.

Discharge circuit 11 includes a plurality of discharge resistors R1 to Rm and a plurality of discharge switches S1 to Sm. Each of the plurality of discharge resistors R1 to Rm and each of the plurality of discharge switches S1 to Sm are series connected to each other and are respectively parallel connected to the plurality of cells E1 to Em. In other words, series circuits each configured with each discharge resistor R1 to Rm and each discharge switch S1 to Sm are each connected between neighboring two voltage lines. Discharge switches S1 to Sm are configured with, for example, semiconductor switches.

Because voltage measurement unit 12 is in a high voltage state with respect to controller 15, voltage measurement unit 12 and controller 15 are connected to each other through communication lines in an insulated state. Voltage measurement unit 12 can be configured with a general-purpose analog front-end IC or an application specific integrated circuit (ASIC). Voltage measurement unit 12 includes a multiplexer and an A/D converter. The multiplexer outputs to the A/D converter the voltage between neighboring two voltage lines in order from above. The A/D converter converts an analog voltage having been input from the multiplexer, into a digital value.

Temperature measurement unit 13 includes a voltage dividing resistor and an A/D converter. The A/D converter converts a voltage divided by temperature sensor T1 and the voltage dividing resistor into a digital value and outputs the converted digital value to controller 15. Controller 15 estimates the temperature of the plurality of cells E1 to Em on the basis of the digital value.

Current measurement unit 14 includes a differential amplifier and an A/D converter. The differential amplifier amplifies a both-end voltage of shunt resistor Rs and outputs the amplified both-end voltage to the A/D converter. The A/D converter converts the voltage having been input from the differential amplifier into a digital value, and outputs the digital value to controller 15. Controller 15 estimates a current flowing through the plurality of cells E1 to Em on the basis of the digital value.

Note that, when an A/D converter is mounted on controller 15 and an analog input port is provided on controller 15, temperature measurement unit 13 and current measurement unit 14 may output analog voltages to controller 15 so that the analog voltages can be converted into digital values by the A/D converter in controller 15.

Controller 15 manages power storage module 20 on the basis of the voltages, the temperature, and the current of the plurality of cells E1 to Em that were measured by voltage measurement unit 12, temperature measurement unit 13, and current measurement unit 14. Controller 15 can be configured with a microcomputer and a non-volatile memory (for example, an EEPROM or a flash memory).

Controller 15 estimates a state of charge (SOC) and a state of health (SOH) of each of the plurality of cells E1 to Em. The SOC can be estimated by the OCV method or the current integration method. In the OCV method, the SOC is estimated on the basis of the OCV of each cell E1 to Em measured by voltage measurement unit 12 and on the basis of characteristic data of an SOC-OCV curve held by the non-volatile memory. In the current integration method, the SOC is estimated on the basis of the OCV of each cell E1 to Em measured by voltage measurement unit 12 when charging or discharging is started and on the basis of an integrated value of the current measured by current measurement unit 14.

The SOH is defined by a ratio of a current full charge capacity to an initial full charge capacity, and a lower numerical value (closer to 0%) indicates that degradation has further developed. The SOH may be calculated from capacity measurement by fully charging or discharging or may be calculated by adding storage degradation and cycle degradation together. The storage degradation can be estimated on the basis of the SOC, the temperature, and a storage deterioration speed. The cycle degradation can be estimated on the basis of an SOC range of use, the temperature, the current rate, and a cycle deterioration speed. The storage deterioration speed and the cycle deterioration speed can be previously derived by an experiment or a simulation. The SOC, the temperature, the SOC range, and the current rate can be obtained by measurement.

Further, the SOH can be estimated on the basis of a correlation between the SOH and an internal resistance of a cell. The internal resistance can be estimated by dividing a voltage drop occurring when a predetermined current flows through a cell for a predetermined time by the predetermined current value. The internal resistance has a relation that the internal resistance decreases as the temperature rises, and has a relation that the internal resistance increases as the SOH decreases. The degradation of the cell progresses as the number of charge and discharge cycles increases. Further, the degradation of the cell depends also on individual differences and usage environments. Therefore, basically, a variation of capacity between the plurality of cells E1 to Em increases as the cells are used for a longer period.

Controller 15 manages power storage module 20 such that when abnormality occurs to at least one of the plurality of cells E1 to Em, controller 15 turns off first relay RY1 and/or second relay RY2 to protect the plurality of cells E1 to Em Controller 15 manages power storage module 20 by performing an equalization process of the plurality of cells E1 to Em. In basic control of the equalization process by a passive balancing method, the voltage or capacity of the cell that has the smallest voltage or capacity in the plurality of cells E1 to Em is set as a target, and the voltages or capacities of the other cells are equalized to the target. Controller 15 determines discharge time for each of the other cells to equalize the voltage or capacity of each of the other plurality of cells to the voltage or capacity of the cell having the smallest voltage or capacity. Controller 15 determines the discharge time for each discharge circuit on the basis of discharge capacities based on the difference between the current voltages or capacities of the other plurality of cells and a target voltage or target capacity of the equalization and on the basis of the resistance value of the discharge resistor. Note that the resistance values of the plurality of discharge resistors R1 to Rm are set to the same value.

Controller 15 controls on and off of the discharge switch of each of the other plurality of cells on the basis of each determined discharge time. Specifically, controller 15 transmits to voltage measurement unit 12 a control signal that defines on-and-off timings of discharge switches S1 to Sm, and voltage measurement unit 12 controls on and off of discharge switches S1 to Sm on the basis of the received control signal. In the discharge circuit whose discharge switch is in an on-state, a current flows from the parallel-connected cell to the discharge resistor, and the voltage or capacity of the cell decreases.

The equalization process is basically performed during an idle (=pause) period of power storage module 20. Because the measured voltages of the plurality of cells E1 to Em measured during charging or discharging of power storage module 20 (the measured voltage is CCV: Closed Circuit Voltage) include voltage drops IR caused by the internal resistances, it is impossible to measure the OCVs of the plurality of cells E1 to Em. Further, also immediately after the end of charging or discharging, the overvoltage components due to polarization remain in the measured voltages of the plurality of cells E1 to Em until the polarization disappears. When the equalization process is performed while the overvoltage components are remaining, the variation between the cells can be increased in some cases.

Figure 2:
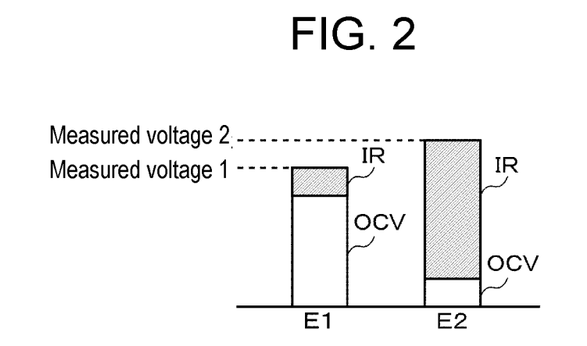
FIG. 2 is a diagram showing how a variation between cells is increased by an equalization process.

FIG. 2 is a diagram showing how a variation (=dispersion) between cells is increased by an equalization process. For the sake of simplicity, FIG. 2 shows an example of the equalization process between two cells E1, E2. In the state of FIG. 2, the measured voltage of cell E1 is lower than the measured voltage of cell E2, and the OCV of cell E1 with the overvoltage component IR removed is higher than the OCV of cell E2 with the overvoltage component IR removed. When the equalization process is performed on the basis of the measured voltages in this state, cell E2 is discharged and the OCV of cell E2 is reduced, thereby increasing the difference in OCV between the two cells.

A convergence time for the measured voltage to converge to the OCV containing no overvoltage component after the end of charging or discharging depends on the negative electrode material, the SOH, the temperature, and the like. For example, in the case where a graphite negative electrode is used, the above convergence time is about one hour at a beginning of life (BOL) of the cell, and the above convergence time is about three hours at an end of life (EOL) of the cell.

As described above, the charging time has increased with increase in capacity of the in-vehicle battery. In the case where the equalization process is not performed in the above convergence time, there is a possibility that the equalization process is not performed in a single parking period. To address the above issue, in the present exemplary embodiment, assuming that in the cell whose measured voltage is largely different from those of the other cells after the end of charging or discharging, the OCV containing no overvoltage component is also largely different from those of the other cells, the equalization process is started before the measured voltage converges to the OCV containing no overvoltage component. The equalization process is performed to equalize the measured voltages of the cell to a target voltage. In the equalization process, the target voltage is set by adding a margin to an equalization standard voltage, and the equalization standard voltage is a minimum voltage of cell obtained from a minimum measured voltage, which is the measured voltage of the cell having the lowest measured voltage of the measured voltages or from an estimated minimum voltage, which is the estimated voltage of the cell having the lowest estimated voltage of the estimated voltages that are estimated as substantive voltages, in which the measured voltages have converged to voltages of OCVs containing no overvoltage component. The above margin is changed corresponding to the magnitude of an amount of change of the overvoltage component in a predetermined period, and is set smaller as the amount of change of the overvoltage component in the predetermined period becomes smaller. Therefore, as the measured voltages converge toward the OCVs containing no overvoltage component with a lapse of time from the end of charging or discharging, the target voltage becomes lower. Accordingly, the amount of discharge of cell while performing the equalization process is increased, and the number of object cells on which the equalization process is performed is increased.

In a similar manner to the above OCV, the equalization process can be performed on the basis of the SOC. In this case, assuming that there is a large SOC error component contained in a cell whose detected SOC detected after the end of charging or discharging is largely different from the detected SOCs of the other cells, the equalization process is started before the SOC error component of the detected SOC converges to a predetermined level or lower. The equalization process is performed to equalize the detected SOC of the cell to a target SOC, In the equalization process, the target voltage is set by adding a margin to an equalization standard SOC, and the equalization standard SOC is a minimum SOC of cell obtained from a detected minimum SOC, which is the detected SOC of the cell having the lowest SOC of the detected SOCs or from an estimated minimum SOC, which is the estimated SOC of the cell having the lowest estimated SOC of the estimated SOCs that are estimated as substantive SOCs, in which the SOC error components have converged to a predetermined level or lower. The above margin is changed corresponding to the magnitude of an amount of change of the SOC error component in a predetermined period, and is set smaller as the amount of change of the SOC error component in the predetermined period becomes smaller. Therefore, as the detected SOCs converge toward the substantive SOCs, whose SOC error components are less than or equal to the predetermined level, with a lapse of time from the end of charging or discharging, the target SOC becomes lower. Accordingly, the amount of discharge of cell while performing the equalization process is increased, and the number of object cells on which the equalization process is performed is increased.

Alternatively, instead of the target voltage in the case of OCV or instead of the target SOC in the case of SOC, a rechargeable capacity to a full charge capacity (FCC) can be set as the target to perform the equalization process. Note that the rechargeable capacity is calculated by subtracting a current residual (=remaining) capacity from the FCC. In this case, the FCC is estimated from the SOC or the OCV, so that the rechargeable capacity is calculated. The equalization process is performed aiming for a target rechargeable capacity, and the target rechargeable capacity is set by subtracting a margin from an equalization standard rechargeable capacity, which is the maximum rechargeable capacity C of the cell having the largest rechargeable capacity of the rechargeable capacities of all the target cells. The above margin is changed corresponding to the magnitude of an amount of change of the SOC error component or the overvoltage component in a predetermined period, and is set smaller as the amount of change of the SOC error component or the overvoltage component in the predetermined period becomes smaller. Therefore, as the detected SOCs converge toward the substantive SOCs, whose SOC error components are less than or equal to a predetermined level, with a lapse of time from the end of charging or discharging, or as the measured voltages converge toward the OCV containing no overvoltage component, the target rechargeable capacity becomes larger. In other words, the equalization process is performed with the target rechargeable capacity set in such a manner that the larger the amount of change of the SOC error components or the overvoltage components in the predetermined period is, the higher the target SOC or the value of the target voltage is higher.

Figure 3:
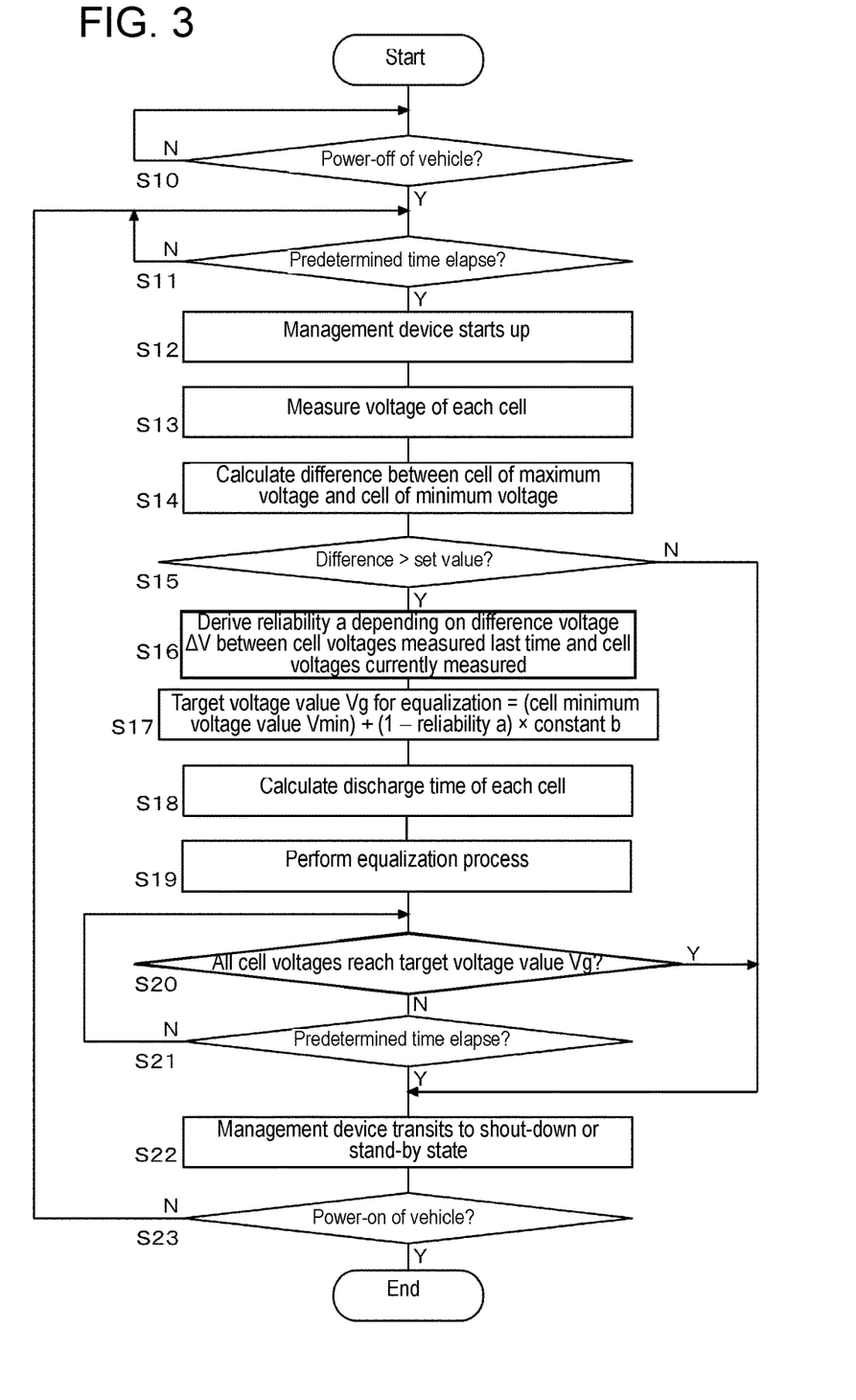
FIG. 3 is a flowchart for describing an equalization process according to the exemplary embodiment of the present invention.

FIG. 3 is a flowchart for describing an equalization process according to the exemplary embodiment of the present invention, and shows an example in which the target voltage for the equalization process is based on the minimum voltage of the cells. If a power source of a vehicle is turned off (corresponding to ignition-off of an engine vehicle) by a driver after end of running (step S10: Y), management device 10 transits to a shout-down or stand-by state. In the present exemplary embodiment, management device 10 is assumed to be mounted with a regular start-up function. If a predetermined time (for example, 15 minutes) has elapsed (step S11: Y), management device 10 starts up from the shout-down or stand-by state (step S12).

Voltage measurement unit 12 measures a voltage of each of the plurality of cells E1 to Em (step S13). Controller 15 calculates a difference between a cell having a maximum voltage and a cell having a minimum voltage of the plurality of cells E1 to Em (step S14). The difference may be a difference in voltage or a difference in SOC. Controller 15 compares the calculated difference with a set value (step S15). The set value is set by a designer on the basis of experimental data or simulation data. If the difference is less than or equal to the set value (step S15: N), the equalization process is not necessary, and management device 10 therefore transits to the shout-down or stand-by state (step S22).

If the difference is more than the set value (step S15: Y), controller 15 calculates a difference voltage $\Delta V$ between the voltages of the plurality of cells E1 to Em measured last time and the voltages of the plurality of cells E1 to Em currently measured. For example, the difference voltage $\Delta V$ may be a total voltage of the difference voltage for each cell. Controller 15 calculates or derives a reliability a depending on the difference voltage $\Delta V$ (step S16).

The reliability a has a coefficient having a negative correlation with the difference voltage $\Delta V$ and is an index that shows how much the measured voltages are reliable as substitutes for the OCVs containing no overvoltage component. The reliability a is defined as a value normalized in a range from 0 to 1 inclusive, and when the difference voltage $\Delta V$ is 0, the reliability a is 1. When the difference voltage $\Delta V$ is more than or equal to an expected maximum value, the reliability a is 0.

Controller 15 calculates the target voltage value Vg for equalization by using Equation 1 below (step S17). The constant b is a constant to set strength of the equalization process. As the constant b is larger, the equalization process is lighter. Accordingly, the margin, which is put on a minimum voltage value Vmin of the plurality of cells E1 to Em when the target voltage value Vg for equalization is calculated, becomes larger. The constant b is set by a designer on the basis of experimental data or simulation data.

Target voltage value *Vg* for equalization=
(cells' minimum voltage value *V*min)+
(1−reliability *a*)×constant *b*     Equation 1

Controller 15 determines the discharge time of each cell on the basis of the calculated target voltage value Vg (step S18). Controller 15 performs the equalization process on the basis of the discharge time of each cell (step S19). If all the voltages of cells E1 to Em have reached the target voltage value Vg (step S20: Y), the equalization process is finished, and management device 10 resets a measurement of the predetermined time and transits to the shout-down or stand-by state (step S22). If not all the voltages of cells E1 to Em have reached the target voltage value Vg (step S20: N) and the predetermined time (the same time as in step S11) has elapsed (step S21: Y), the equalization process is finished, and management device 10 resets the measurement of the predetermined time and transits to the shout-down or stand-by state (step S22). In the above, the process from step S11 to step S22 is repeatedly performed as long as the power source of the vehicle is not turned on (corresponding to ignition-on of an engine vehicle) (step S23: N).

Note that when the difference voltage $\Delta V$ becomes 0, the reliability a hence becomes 1; therefore, the above Equation 1 represents the relation: Target voltage value Vg for equalization=cells' minimum voltage value Vmin. That is, the equalization process is the same process as in the general equalization process.

The equalization process shown in FIG. 3 may be stopped or may not be stopped in a charging period, in which charging is performed from charger 4. The difference voltage $\Delta V$ is larger in the charging period; therefore, if the equalization process is continued also in the charging period, a light equalization process is repeatedly performed.

Figure 4:
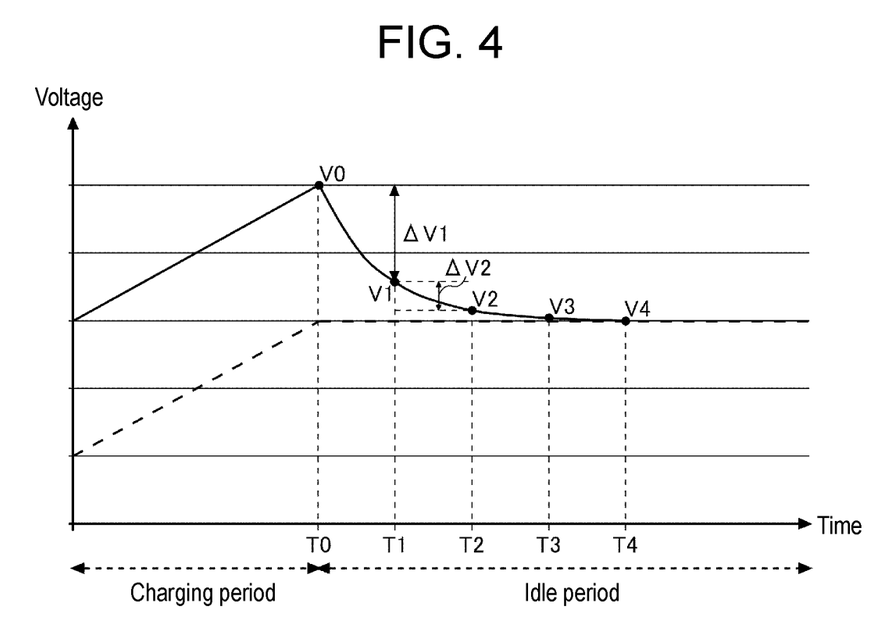
FIG. 4 is a diagram showing an example of transition of a measured voltage and an OCV containing no overvoltage component during a charging period and an idle period.

FIG. 4 is a diagram showing an example of transition of a measured voltage and an OCV containing no overvoltage component during a charging period and an idle period. In FIG. 4, the measured voltage is depicted by a bold solid line, and the OCV containing no overvoltage component is depicted by a bold dotted line. When charging is finished, the measured voltages are gradually getting close to the OCVs containing no overvoltage component. In other words, the effect of the overvoltage components is gradually decreasing. In that process, the difference voltage ΔV is also decreasing gradually.

Figure 5:
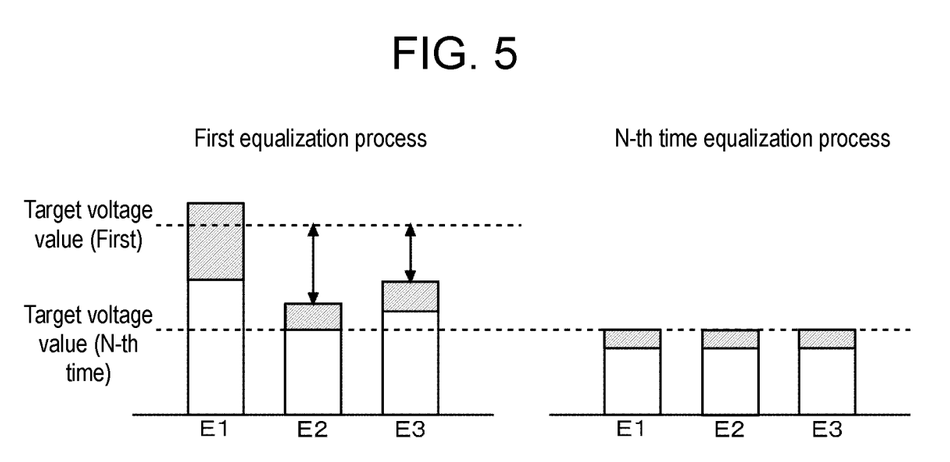
FIG. 5 is a diagram showing an example of how the variation between cells is decreasing by an equalization process according to the exemplary embodiment of the present invention.

FIG. 5 is a diagram showing an example of how the variation between cells is decreasing by an equalization process according to the exemplary embodiment of the present invention. For the sake of simplicity, FIG. 5 shows an example of the equalization process between three cells E1 to E3. In the first equalization process (the equalization process immediately after the end of charging or discharging), the target voltage value Vg for equalization is set to a value having a large margin with respect to the voltage of cell E2 having the minimum voltage. In the example shown in FIG. 5, the voltage of cell E1 is reduced by discharge, but cell E3 is not discharged. With increase in the number of equalization processes, the margin with respect to the minimum cell voltage becomes smaller, and the amount of discharge and the number of cells to be discharged increase. In the N-th time equalization process, the target voltage value Vg for equalization is close to substantially the same value as the value of the OCV containing no overvoltage component.

As described above, according to the present exemplary embodiment, the target value Vg for equalization is set higher as the amount of changes in the voltages of the plurality of cells E1 to Em in a predetermined period are larger. With this arrangement, even in a state where the measured voltages have not converged to the OCVs containing no overvoltage component, the equalization process is steadily performed in the direction to reduce the variation between cells.

The target value Vg for equalization is set to the value in which a margin adjusted based on the reliability a is added to the minimum voltage value Vmin of the cells. When the reliability a is low, the margin is set larger, and it is therefore possible to restrain the equalization process in the direction to enlarge the variation between cells as shown in FIG. 2.

Further, also in the case of low reliability a, a light equalization process is performed. Therefore, even in the case where there is a short or no period in which the cells are idle in the state where the OCVs contain no overvoltage component, the variation between cells can be reduced. For example, even in the case where the vehicle is started immediately after charging is finished, the variation between cells can be reduced.

In the above, the present invention has been described based on the exemplary embodiment. The exemplary embodiment is a merely example, and those skilled in the art will understand that various modifications can be made in the combination of the configuration elements or the processes in the exemplary embodiment and that such modifications are also within the scope of the present invention.

In the above exemplary embodiment, the description is given mainly to the example in which the above equalization process is performed in the idle period when neither charging nor discharging is performed. At this point, as described above, the above equalization process may be performed also in the period when charging is performed from charger 4. In that case, the value of the constant b may be set larger than in the idle period in which neither charging nor discharging is performed. Further, the above equalization process may be performed also when the vehicle is running. In that case, the value of the constant b may be set still larger. When the vehicle is running, discharging due to power running and charging due to regeneration occur irregularly; therefore, the reliability of the measured voltages of cells E1 to Em further decrease. By setting the value of the constant b larger, the margin can be made still larger.

In the above exemplary embodiments, the description has been given on the example in which the above equalization process is used in power storage system 1 for in-vehicle use. However, the above equalization process can be used also in power storage system 1 for stationary power storage use. In addition, the above equalization process can be used also in power storage system 1 for electronic equipment use such as laptop PCs and smartphones.

Note that the exemplary embodiment may be specified by the following items.

[Item 1]

Management device (10) includes:

voltage detector (12) that detects a voltage of each of a plurality of cells (E1 to Em) that are series-connected;

a plurality of discharge circuits (11) respectively parallel-connected to the plurality of cells (E1 to Em); and controller (15) that performs control to equalize voltages or capacities of the plurality of cells (E1 to Em) to a target value by controlling discharge time of the plurality of discharge circuits (11), based on the voltages of the plurality of cells (E1 to Em) detected by voltage detector (12).

Controller (15) sets the target value higher as an amount of change in the voltages of the plurality of cells (E1 to Em) in a predetermined period is larger.

This arrangement can steadily perform an equalization process even between a plurality of cells (E1 to Em) that cannot take sufficient idle time.

[Item 2]

In management device (10) according to item 1, when the amount of change is zero, controller (15) sets a voltage of a cell having a lowest voltage of the voltages of the plurality of cells (E1 to Em) as the target value.

This arrangement enables a normal equalization process to be performed when the amount of change becomes zero.

[Item 3]

In management device (10) according to item 1, when the amount of change is zero, controller (15) sets a rechargeable capacity of a cell having a largest rechargeable capacity of rechargeable capacities of the plurality of cells (E1 to Em) as the target value.

This arrangement enables a normal equalization process to be performed when the amount of change becomes zero.

[Item 4]

In management device (10) according to any one of items 1 to 3, in an idle period of the plurality of cells (E1 to Em), controller (15) causes voltage detector (12) to regularly detect the voltages of the plurality of cells (E1 to Em), calculates an amount of change between the voltages of the plurality of cells (E1 to Em) detected last time and the voltages of the plurality of cells (E1 to Em) detected this time, and performs an equalization process between the plurality of cells (E1 to Em), based on a target value depending on the amount of change.

This arrangement can steadily perform the equalization process, in an idle period of the plurality of cells (E1 to Em), before the detected voltages converge to the OCVs containing no overvoltage component.

[Item 5]

Power storage system (1) includes:

a plurality of cells (E1 to Em) that are series-connected; and management device (10) according to any one of items 1 to 4 that manages the plurality of cells (E1 to Em).

This arrangement can constitute power storage system (1) that can steadily perform the equalization process between the plurality of cells (E1 to Em) that cannot take sufficient idle time.

[Item 6]

In power storage system (1) according to item 5, power storage system (1) is mounted on a vehicle, and during parking of the vehicle, management device (10) regularly starts up to cause voltage detector (12) to detect the voltages of the plurality of cells (E1 to Em).

This arrangement can put management device (10) in a shut-down or stand-by state during parking of the vehicle and can therefore reduce a power consumption of management device (10).

The invention claimed is:

1. A management device comprising:
    a voltage detector that detects a voltage of each cell of a plurality of cells that are series-connected;
    a plurality of discharge circuits respectively parallel-connected to the plurality of cells; and
    a controller that performs a control to equalize voltages or capacities of the plurality of cells to a target value by controlling discharge time of the plurality of discharge circuits, based on the voltages of the plurality of cells detected by the voltage detector,
    wherein the controller sets the target value higher as an amount of change in the voltages of the plurality of cells in a predetermined period is larger, and the target value is common to the plurality of cells.

2. The management device according to claim 1 wherein, when the amount of change is zero, the controller sets a voltage of a cell having a lowest voltage of the voltages of the plurality of cells as the target value.

3. The management device according to claim 1, wherein, when the amount of change is zero, the controller sets a rechargeable capacity of a cell having a largest rechargeable capacity of rechargeable capacities of the plurality of cells as the target value.

4. The management device according to claim 1, wherein in an idle period of the plurality of cells, the controller causes the voltage detector to regularly detect the voltages of the plurality of cells, calculates an amount of change between voltages of the plurality of cells detected last time and voltages of the plurality of cells detected this time, and performs an equalization process between the plurality of cells, based on a target value depending on the amount of change.

5. A power storage system comprising:

the plurality of cells that are series-connected; and the management device according to claim 1 that manages the plurality of cells.

6. The power storage system according to claim 5, wherein:

the power storage system is mounted on a vehicle, and during parking of the vehicle, the management device regularly starts up to cause the voltage detector to detect the voltages of the plurality of cells.

* * * * *